United States Patent
Horie et al.

(10) Patent No.: US 8,223,403 B2
(45) Date of Patent: Jul. 17, 2012

(54) INSPECTION APPARATUS, INSPECTION METHOD AND MANUFACTURING METHOD OF MASK FOR EXPOSURE, AND MASK FOR EXPOSURE

(75) Inventors: Tsutomu Horie, Kawasaki (JP); Mitsufumi Naoe, Kawasaki (JP)

(73) Assignee: Fujitsu Semiconductor Limited, Yokohoma (JP)

( * ) Notice: Subject to any disclaimer, the term of this patent is extended or adjusted under 35 U.S.C. 154(b) by 1609 days.

(21) Appl. No.: 11/633,590

(22) Filed: Dec. 5, 2006

(65) Prior Publication Data
US 2007/0285728 A1 Dec. 13, 2007

(30) Foreign Application Priority Data
Jun. 12, 2006 (JP) ................................ 2006-162155

(51) Int. Cl.
G06K 15/00 (2006.01)

(52) U.S. Cl. ........ 358/3.07; 358/1.9; 358/2.1; 358/3.06; 382/144; 382/145; 430/5; 438/34; 716/50

(58) Field of Classification Search ................ 358/3.07, 358/1.9, 2.1; 382/144, 145; 430/5; 716/50; 438/34
See application file for complete search history.

(56) References Cited

U.S. PATENT DOCUMENTS

| 5,764,363 | A * | 6/1998 | Ooki et al. ................ 356/364 |
| 7,660,456 | B2 * | 2/2010 | Ishida et al. .............. 382/144 |
| 2004/0018436 | A1 * | 1/2004 | Ishikawa ...................... 430/5 |
| 2006/0292458 | A1 | 12/2006 | Tsutsui et al. |

FOREIGN PATENT DOCUMENTS

| JP | 10-319572 A | 12/1998 |
| JP | 2003-75981 A | 3/2003 |

* cited by examiner

Primary Examiner — Twyler Haskins
Assistant Examiner — Michael Burleson
(74) Attorney, Agent, or Firm — Fujitsu Patent Center

(57) ABSTRACT

An inspection apparatus of a mask for exposure that has a light shielding region 3 and a half-tone region 2 on a transparent substrate 1, includes a storage unit stored with half-tone pattern area data specifying an existing area of the half-tone region 2, a pattern detection unit 22 acquiring a binary image of an area in which to scan over the surface of the transparent substrate by a relative movement with respect to the transparent substrate, and a control unit 20 making effective a detecting operation of the pattern detection unit in the area on the transparent substrate that is specified by the half-tone pattern area data, and making ineffective the detecting operation of the pattern detection unit outside the specified area.

11 Claims, 13 Drawing Sheets

51

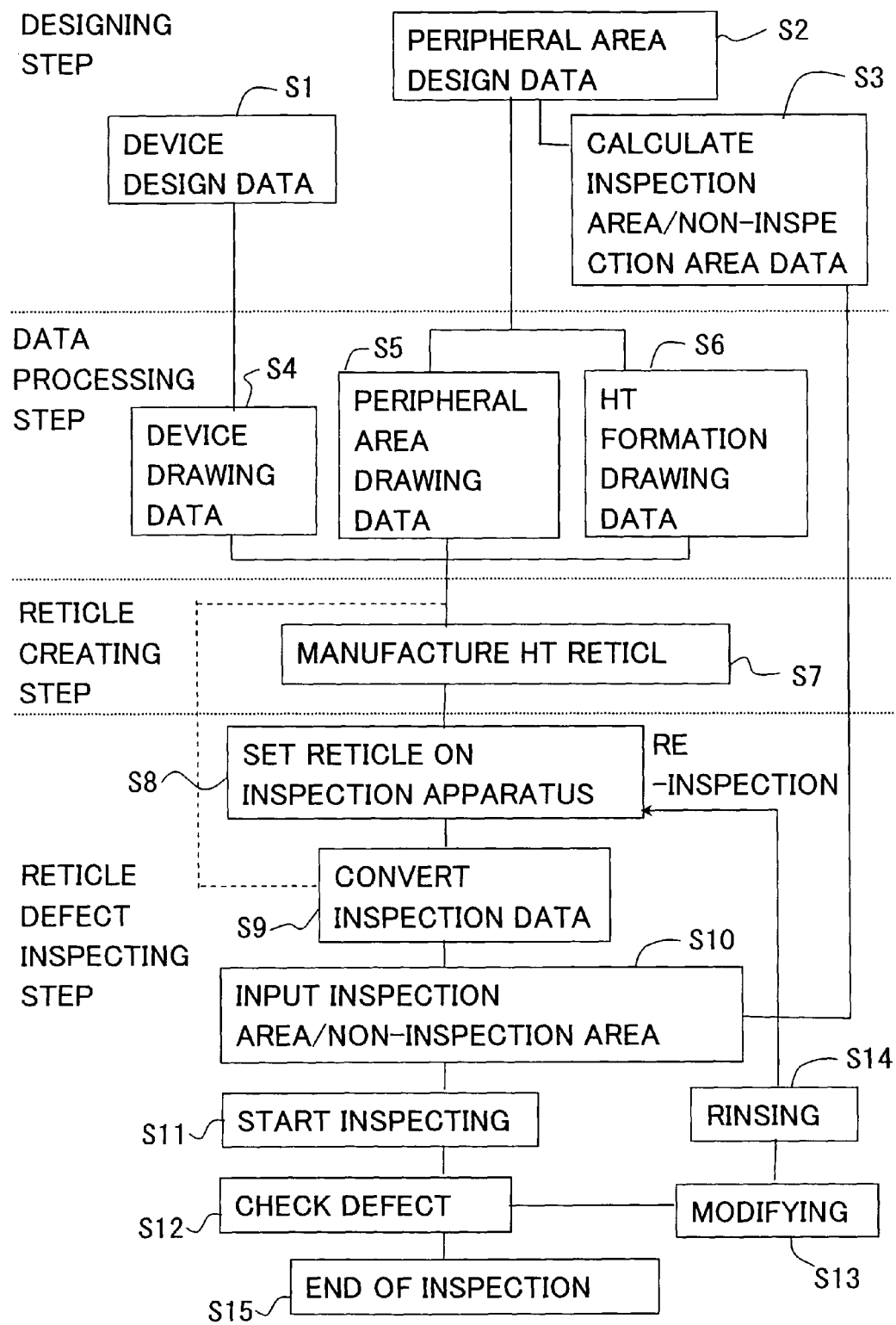

INSPECTION APPARATUS, INSPECTION METHOD AND MANUFACTURING METHOD OF MASK FOR EXPOSURE, AND MASK FOR EXPOSURE

BACKGROUND OF THE INVENTION

The present invention relates to a technology of manufacturing a phase-shift reticle.

BACKGROUND ART

In manufacturing semiconductors over the recent years, along with progresses toward higher integration and higher accuracy, there has increasingly been a case in which especially a reticle structure of a critical layer adopts a phase-shift reticle in place of a conventional binary mask (BIM). Among the reticles, a reticle referred to as a half-tone type reticle is widely employed for manufacturing the device at the present in terms of simplicity in manufacturing.

Normally, when the reticle is manufactured, there is conducted an inspection based on collation (data collation) between a pattern formed on the reticle and design data of the device. This type of reticle inspection involves using a reticle defect inspection apparatus. It should be noted that the following Patent documents concerning the inspection of the phase-shift reticle are known.

[Patent document 1] Japanese Patent Application Laid-Open Publication No. 2003-75981

[Patent document 2] Japanese Patent Application Laid-Open Publication No. 10-319572

SUMMARY OF THE INVENTION

The reticle defect inspection apparatus at the present, however, has ability in inspection to only two tones of a glass layer and a Cr (chrome) region (Cr layer) or only two tones of the glass layer and a half-tone region (half-tone layer) as types of simultaneously inspectable images. Hence, if the conventional reticle defect inspection apparatus simultaneously inspects three tones (tri-tones) of the glass layer, the Cr region and the half-tone region as in the case of the half-tone type reticle, this results in detecting a multiplicity of pseudo defects. Namely, the normal pattern is formed on the reticle, and nevertheless a defect is detected, wherein it is difficult to judge the pattern to be normal or abnormal. Moreover, there are many cases, wherein as a result of detecting the pseudo defects, the inspection can not be performed because of a defect count exceeding a limit of storage capacity. Hence, there is a problem as to how the defect inspection of the half-tone type reticle is accurately and efficiently conducted.

The present invention adopts the following means in order to solve the problems. Namely, the present invention is an inspection apparatus of a mask for exposure that has a light shielding region and a half-tone region on a transparent substrate, comprising a storage unit stored with half-tone pattern area data specifying an existing area of the half-tone region, a pattern detection unit acquiring a binary image of an area in which to scan over the surface of the transparent substrate by a relative movement with respect to the transparent substrate, and a control unit making effective a detecting operation of the pattern detection unit in the area on the transparent substrate that is specified by the half-tone pattern area data, and making ineffective the detecting operation of the pattern detection unit outside the specified area.

According to the present invention, there is provided the control unit making effective the detecting operation of the pattern detection unit in the area on the transparent substrate that is specified by the half-tone pattern area data, and making ineffective the detecting operation of the pattern detection unit outside the specified area, and it is therefore possible to execute the detecting operation or stop the execution corresponding to the shape of the area.

The half-tone pattern area data may include layout data specifying a layout of one or more semiconductor device patterns onto the transparent substrate and segmental area data specifying an existing area of the half-tone pattern region combined with the semiconductor device pattern to be laid out on the transparent substrate on the basis of the layout data.

According to the present invention, the segmental area data are laid out in accordance with the layout data, whereby the half-tone pattern area data can be structured.

The inspection apparatus may further comprise an input unit to which at least one of the half-tone pattern area data, the segmental area data and the layout data is inputted by an operation of an operator. According to the present invention, at least one of the half-tone pattern area data, the segmental area data and the layout data can be inputted via the input unit.

The inspection apparatus may further comprise a first segmental area data generating unit generating the segmental area data from half-tone pattern data that specifies a pattern shape of the half-tone pattern region. According to the present invention, the segmental area data can be generated from the pattern shape of the half-tone pattern region.

The inspection apparatus may further comprise a second segmental area data generating unit generating the segmental area data from semiconductor device design data if data specifying the existing area of the pattern shape of the half-tone pattern region is contained in the semiconductor device design data in which to define plural layers of semiconductor device patterns corresponding to a plurality of manufacturing steps of the semiconductor device. According to the present invention, the data specifying the existing area of the pattern shape of the half-tone pattern can be extracted and thus generated from the semiconductor device design data.

The inspection apparatus may further comprise a first segmental area data generating unit generating the segmental area data from the half-tone pattern data that specifies the pattern shape of the half-tone pattern region, a second segmental area data generating unit generating the segmental area data from semiconductor device design data if data specifying the existing area of the pattern shape of the half-tone pattern region is contained in the semiconductor device design data in which to define plural layers of semiconductor device patterns corresponding to a plurality of manufacturing steps of the semiconductor device, and a comparing unit comparing the segmental area data generated by the first segmental area data generating unit with the segmental area data generated by the second segmental area data generating unit. According to the present invention, the data can be verified by comparing the segmental area data generated by the first segmental area data generating unit with the segmental area data generated by the second segmental area data generating unit.

The pattern detection unit may include a line image detection unit in which plural image detection elements are arranged in line, and the control unit includes a line width control unit that changes a line width of a line image including a combination of detection signals from the image detection units arranged in line when the line image detection unit moves relatively to the transparent substrate. According to the present invention, the image can be detected from the detecting target by changing the line width of the line image.

The present invention may also be a method configured by combining one or more processing procedures described above. The present invention may further be a mask for exposure that is manufactured by such a method.

According to the present invention, the defect inspection of the half-tone type reticle can be conducted accurately and efficiently.

BRIEF DESCRIPTION OF THE DRAWINGS

FIG. 3 is a first flow of inspecting a reticle defect;

DETAILED DESCRIPTION OF THE INVENTION

A reticle defect inspection apparatus according to a best mode (which will hereinafter be termed an embodiment) for carrying out the present invention will hereinafter be described with reference to the drawings. A configuration in the following embodiment is an exemplification, and the present invention is not limited to the configuration in the embodiment. It should be noted that a mask employed in a photolithography step of a semiconductor device is generically referred to as a reticle in the present embodiment.

<Structure and Manufacturing Method of Half-Tone Type Reticle>

Figure 1:
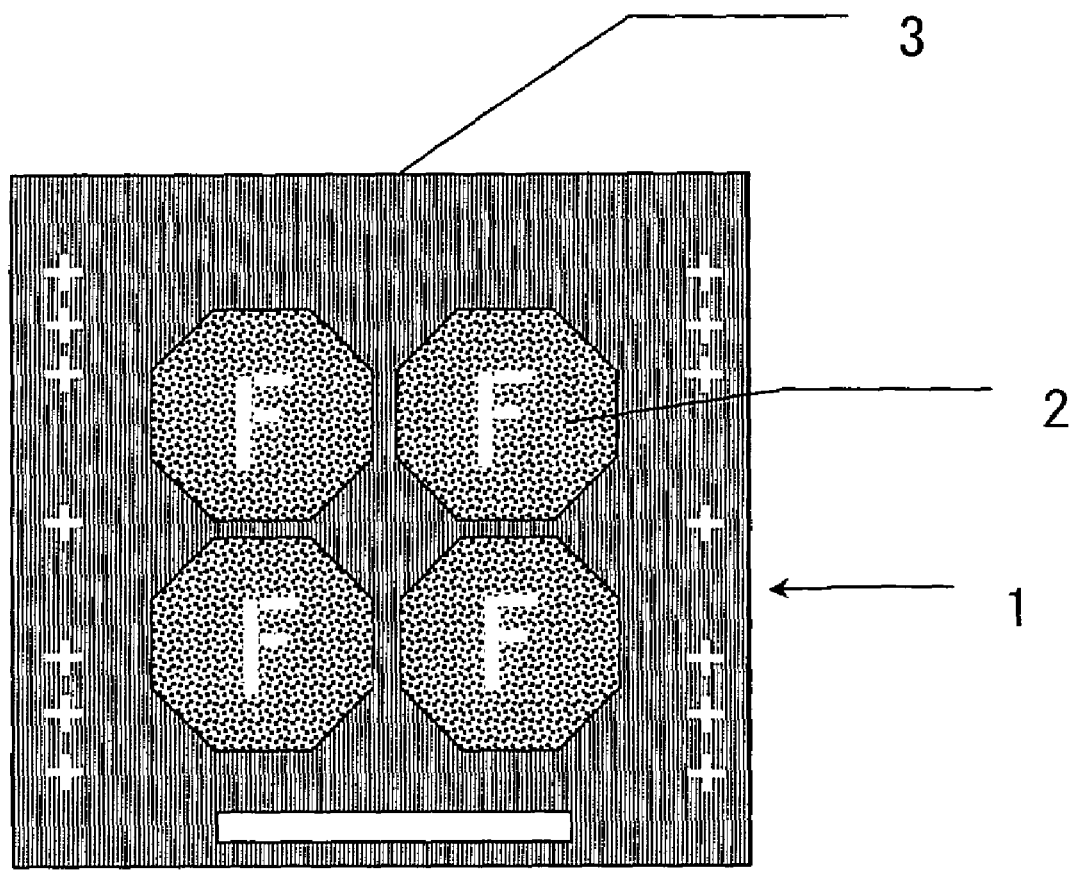
FIG. 1 is a view showing a structure of a half-tone type reticle.

FIG. 1 illustrates a structure of a half-tone type phase shift mask (which will hereinafter be simply termed a half-tone type reticle) used in a step employing a conventional positive type resist. As in FIG. 1, the half-tone type reticle includes a synthetic quartz substrate 1, a half-tone layer 2 (corresponding to a half-tone region according to the present invention) formed on the synthetic quartz substrate 1 (corresponding to a transparent substrate according to the present invention), and a light shielding layer 3 (Which is composed of Cr and corresponds to a light shielding region according to the present invention).

As illustrated in FIG. 1, the half-tone type reticle of this type is provided with a blind pattern (which is a structural layer for preventing multiple exposures upon a neighboring die in wafer transfer) formed of the light shielding layer 3 in an outer peripheral area along a main area (the area where F-shaped patterns exist in FIG. 1) in which circuit patterns exist.

Figure 2A:
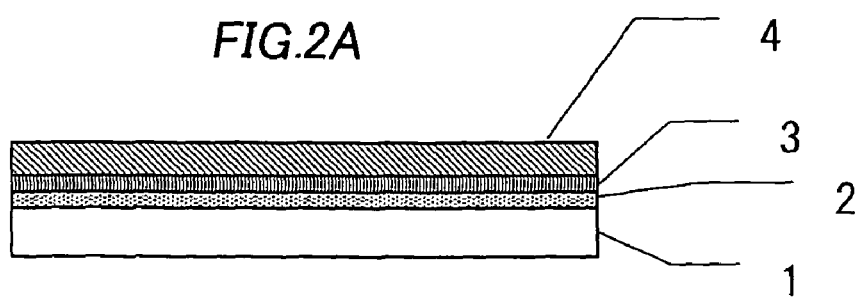
FIG. 2A is a view showing a method of manufacturing a conventional half-tone type reticle (part 1)

FIGS. 2A-2H show a method of manufacturing the conventional half-tone type reticle. As illustrated in FIG. 2A, the half-tone layer 2 and the light shielding layer 3 are stacked on the transparent synthetic quartz substrate 1, and a resist layer 4 is further formed thereon.

Figure 2B:
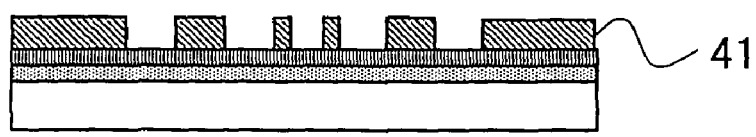
FIG. 2B is a view showing the method of manufacturing the conventional half-tone type reticle (part 2)

Next, as shown in FIG. 2B, the resist layer 4 is exposed to light and then developed, thereby forming a resist pattern 41. A plan view of the first resist pattern 41 is illustrated in, e.g., FIG. 8.

Figure 2C:
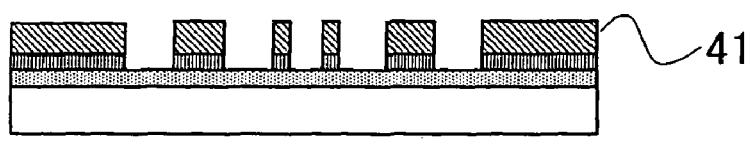
FIG. 2C is a view showing the method of manufacturing the conventional half-tone type reticle (part 3)
Figure 2D:
FIG. 2D is a view showing the method of manufacturing the conventional half-tone type reticle (part 4)

Subsequently, as illustrated in FIGS. 2C-2D, the first resist pattern 41 being used as a mask, the light shielding layer 3 and the half-tone layer 2 are sequentially etched, thus forming a pattern.

Figure 2E:
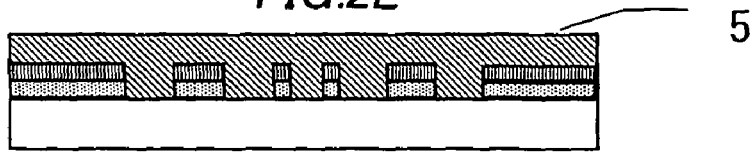
FIG. 2E is a view showing the method of manufacturing the conventional half-tone type reticle (part 5)

Next, as shown in FIG. 2E, after removing the resist layer 4 defined as the first resist pattern 41, a resist layer 5 is again coated, thereby forming a second resist layer.

Figure 2F:
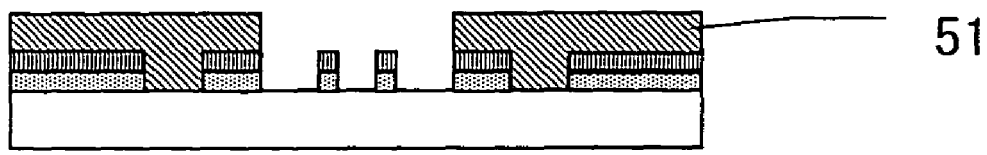
FIG. 2F is a view showing the method of manufacturing the conventional half-tone type reticle (part 6)

Subsequently, as depicted in FIG. 2F, a desired region in the main area is exposed to the light and then developed, thereby forming a second resist pattern 51.

Figure 2G:
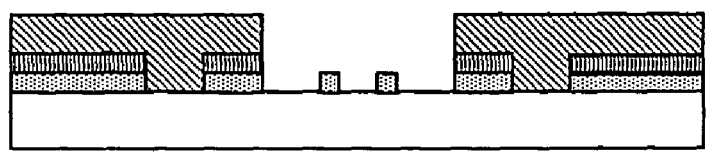
FIG. 2G is a view showing the method of manufacturing the conventional half-tone type reticle (part 7)
Figure 2H:
FIG. 2H is a view showing the method of manufacturing the conventional half-tone type reticle (part 8)

Next, as illustrated in FIG. 2G, the second resist pattern 51 being employed as a mask, the exposed unnecessary light shielding layer 3 is etched. Further, as shown in FIG. 2H, the reticle is completed by removing the resist 5 defined as the second resist pattern 51.

<Outline of Defect Inspection of Reticle>

The reticle manufactured in the procedures described above is collated with design data and thus undergoes a defect inspection. The defect inspection is to inspect whether the as-designed pattern is formed on the reticle or not.

There are, however, the following problems inherent in the inspection of the half-tone type reticle.

(1) A pseudo defect occurs in a tri-tone region of the half-tone type reticle, resulting in an inspection disabled state. Therefore, an inspection area and a non-inspection area must be set in a way that takes an optimal inspection area into consideration. On the occasion of setting the inspection area and the non-inspection area, it is considered that the half-tone area is calculated by utilizing a CAD (Computer Aided Design) from specifications of the peripheral area (which is an alignment area used in a wafer process for forming a device) or from drawing data for forming the half-tone. In any case, however, the area is humanly judged, and hence a tremendous number of steps are required for an area calculating step and for a verifying step.

Figure 4:
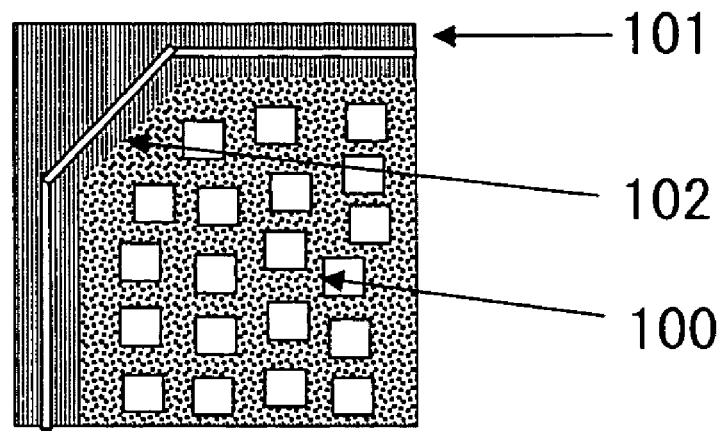
FIG. 4 is a view illustrating an example of an oblique pattern.

(2) A problem occurs in an oblique pattern formed when chamfering a corner region of a semiconductor device area (which is also referred to as a chip area) on the reticle. FIG. 4 shows an example of the oblique pattern. As illustrated in FIG. 4, the pattern on the reticle is separated into a semiconductor device area 100 and a scribe area 101 encompassing the periphery of this semiconductor device area 100. In the semiconductor device area 100, a half-tone layer exists spreading around peripheries of individual chips, depicted by rectangles, of the semiconductor devices. On the other hand, the scribe area 101 is formed from a light shielding material (chrome) on the synthetic quartz substrate 1. Further, in FIG. 4, a corner region 102 of the semiconductor device area 100 is chamfered, thereby forming the oblique pattern extending in directions of approximately 45 degrees to both of lengthwise and crosswise sides of the reticle outer peripheral area.

In the conventional reticle defect inspection apparatus, CCD elements arrayed in line scan over the reticle, and the inspection target area must therefore have no alternative but to take the rectangular shape. Hence, in a case where the semiconductor device area 100 and the scribe area 101 are separated by this type of oblique pattern, it follows that the tri-tone region is scanned, wherein the problem given above occurs.

Such being the case, on the occasion of conducting the defect inspection by the data collation, for example, when inspecting the pattern with the chip corner etc chamfered on the reticle, it is required that the inspection area be designated by the rectangle.

As a result, the inspection area is limited, and an effective area of the device is restricted. Hence, a chip area corresponding to a dimension of that area increases, resulting in a decrease in yield.

A first flow considered in order to solve the problems will hereinafter be described with reference to FIG. 3. In the first flow, the design data are designed by a device design (S1) and a peripheral area design (S2). Further, after designing the peripheral area, there are calculated coordinate values for designating the inspection area and the non-inspection area (S3), which are used in a half-tone reticle defect inspection step (S10). The coordinate values are calculated based on setting values inputted by, e.g., an operator.

In a data processing step (S4-S6), for creating reticle drawing data, the device drawing data are created from the device design data (a result of S1) (S4). The peripheral area drawing data and the drawing data for forming the half-tone layer are created from the peripheral area design data (the result of S2) (S5, S6). In the reticle manufacturing step (S7), the half-tone reticle is manufactured according to the drawing data created in S4-S6 by use of a reticle drawing apparatus.

In the reticle defect inspection step (S8-S13), the half-tone reticle is set on the reticle defect inspection apparatus (S8). Further, the device drawing data (a result of S4) and the peripheral area drawing data (a result of S5) are converted into inspection data (S9). The inspection data are employed for collation with an image detected from the inspection target reticle.

As described above, the conventional reticle defect inspection apparatus does not have enough ability to simultaneously inspect the patterns including the half-tone layer 2, the light shielding layer 3 and the transparent layer (which is also termed a glass layer) of the synthetic quartz substrate 1 on the half-tone type reticle. Therefore, the normal inspection of the defect can not be implemented only by using the inspection data created in the inspection data converting process in S9. Such being the case, coordinates for defining the inspection area (see FIG. 5) for specifying the area of the half-tone layer 2 and defining the non-inspection area (see FIGS. 6 and 7) for eliminating the light shielding layer 3 on the half-tone type reticle, are inputted to the reticle defect inspection apparatus in the process in S3. Thus, the inspection range is specified, whereby the defect inspection can be done in a way that generates a binary image between the half-tone layer 2 and the glass layer. In this case, only the rectangles can be designated as shapes of the inspection area and the non-inspection area of the conventional reticle defect inspection apparatus. This is because the conventional reticle defect inspection apparatus employs the line-array CCD elements that scan the inspection area of the designated rectangle and detect the image thereof.

Figure 5:
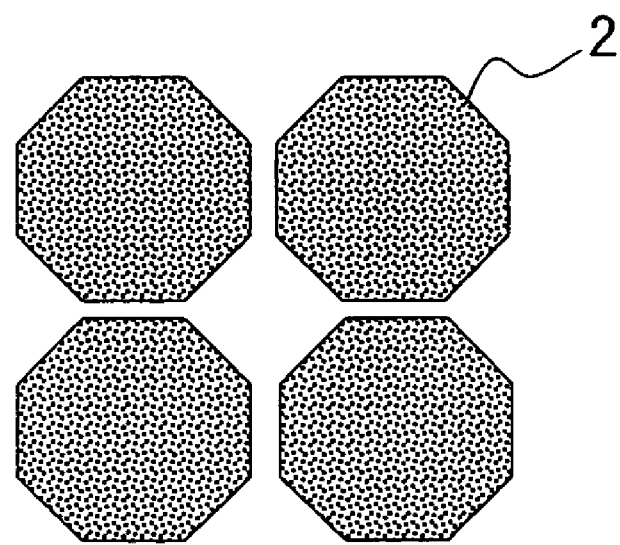
FIG. 5 is a view showing a drawing pattern of a half-tone layer on the half-tone type reticle.

FIG. 5 illustrates an area of a drawing pattern (corresponding to half-tone pattern data according to the present invention) inputted to an electron-beam lithography system (an apparatus for forming the pattern on the reticle) for forming the half-tone layer 2. In the drawing pattern in FIG. 5, data specifying one area (a single octagonal area in FIG. 5) corresponding to one semiconductor device corresponds to segmental area data.

Figure 8:
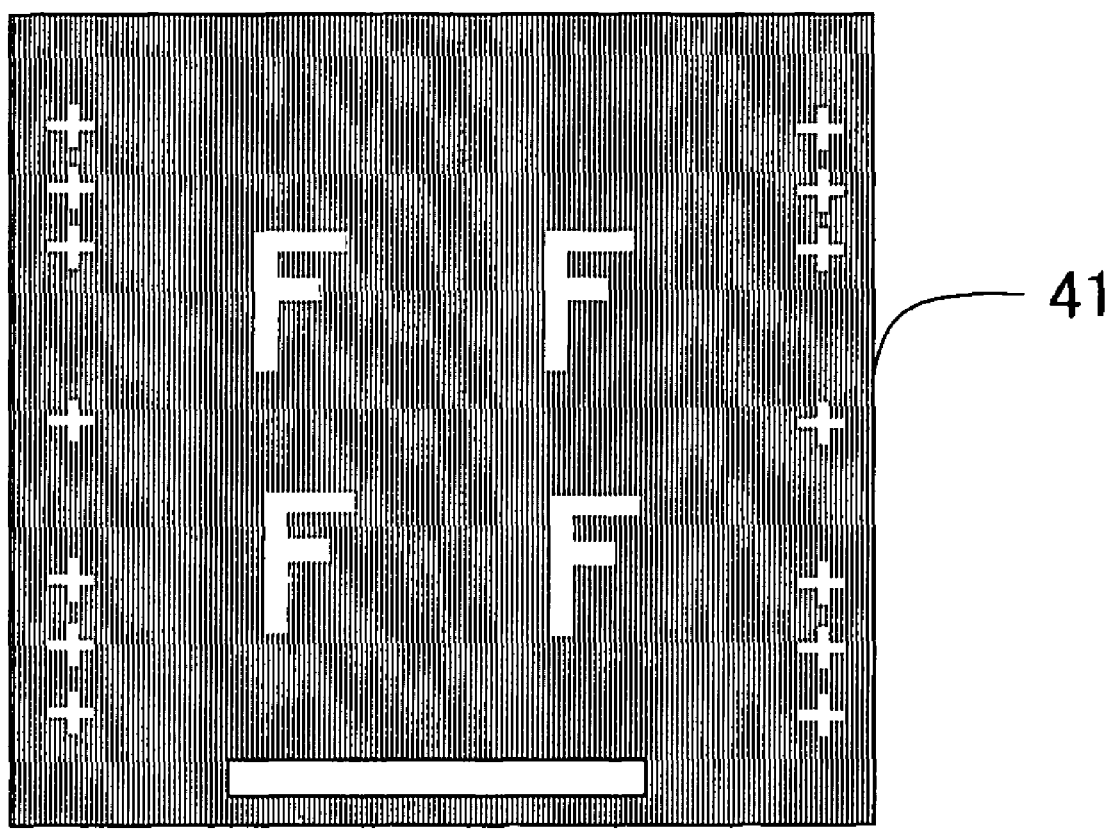
FIG. 8 is a view showing a drawing pattern inputted to an electron-beam lithography system in order to form a light shielding layer 3 (glass layer)

Moreover, FIG. 8 illustrates an area of the drawing pattern inputted to the electron-beam lithography system in order to form the light shielding layer 3 (the Cr layer). As already shown in FIGS. 2A-2H, the half-tone type reticle is formed by forming the pattern (drawing, developing and etching) of the light shielding layer 3 and the pattern (drawing, developing and etching) of the half-tone layer 2.

Figure 6:
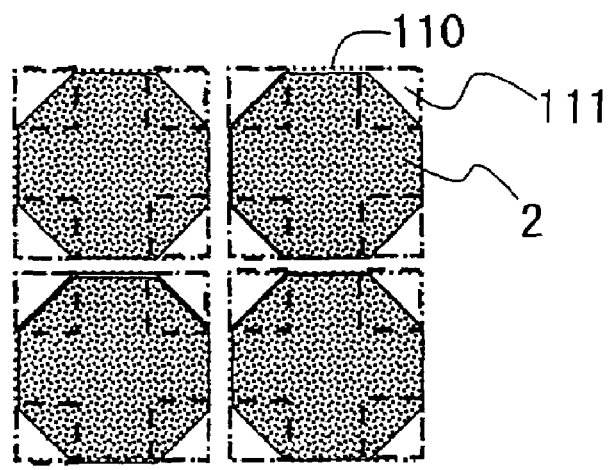
FIG. 6 is a view depicting an inspection area and a non-inspection area on the half-tone type reticle.
Figure 7:
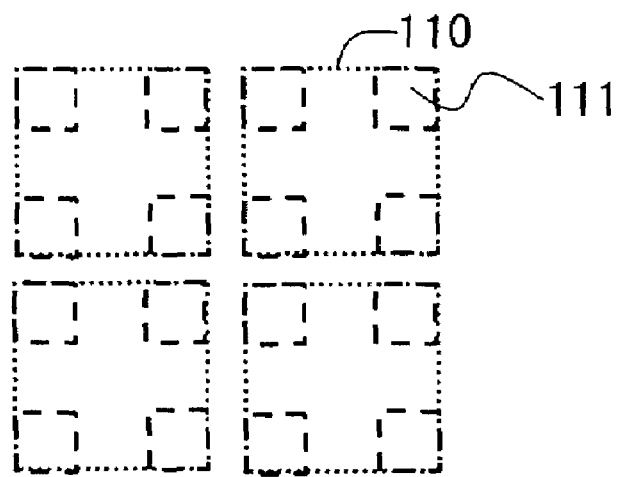
FIG. 7 is a view showing the inspection area and the non-inspection area on the half-tone type reticle.

The first flow is such that in an inspection area/non-inspection area calculation process in S3, an inspection area 110 and non-inspection areas 111 of the half-tone layer 2 are set through inputting by the operator. As shown in FIGS. 6 and 7, the inspection area 110 of the half-tone layer 2 is set as the rectangle encompassing the half-tone layer 2. Further, the non-inspection areas 111 are set as the rectangles that eliminate the corner regions in the inspection area 110 of the half-tone layer 2.

The inspection area 110 and the non-inspection areas 111 are calculated in a coordinate system on the reticle and set in the reticle defect inspection apparatus, thereby making it possible to avoid scanning the tri-tone region.

According to the procedures of the first flow shown in FIG. 3, however, after all, the non-inspection areas are set as the rectangles with the result that the half-tone layer 2 can not effectively formed in the non-inspection areas (even when formed, the half-tone layer can not be inspected). Accordingly, this results in decreasing the semiconductor device area on the reticle. Moreover, since the inspection area and the non-inspection area are set humanly, there might be a case where a tremendous number of steps occur depending on conditions such as existing positions of the half-tone regions, the number of these half-tone regions, and so on.

<Image Detecting Unit of Defect Inspection Apparatus for Inspecting Oblique Area>

To obviate the problems given above, in the present embodiment, the defect inspection apparatus is constructed by employing an image detecting unit that detects an image of an oblique area. Herein, "detecting the image of the oblique area" connotes detecting the image by scanning an area including two oblique lines of a trapezoidal shape in a heightwise direction of the trapezoid (in the direction orthogonal to an upper base and a lower base) in place of the inspection area taking the rectangular (striped) shape as in the conventional inspection area.

Figure 9:
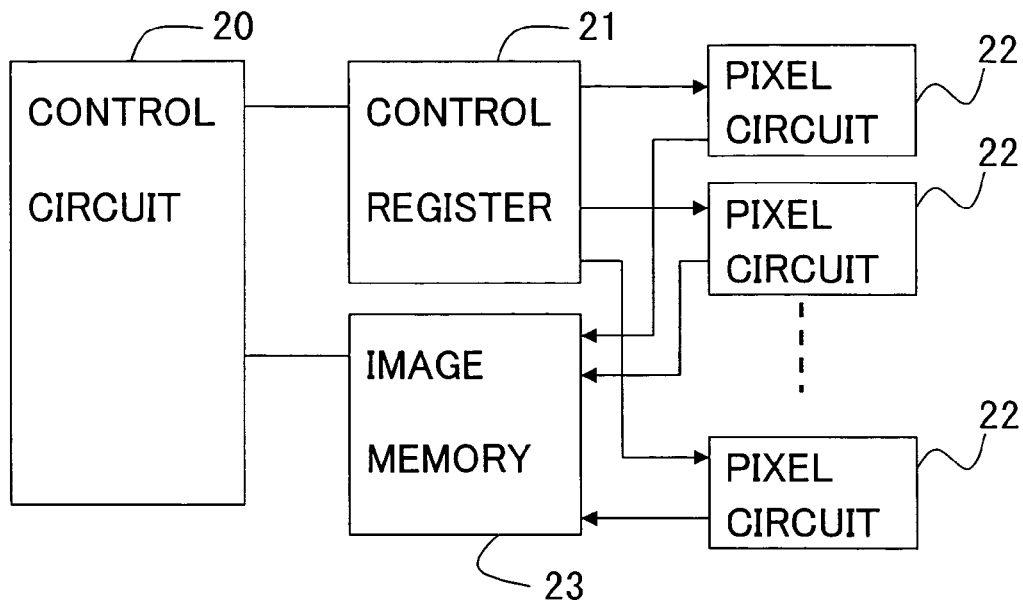
FIG. 9 is a diagram illustrating a configuration of an image detection unit that detects an oblique area.

FIG. 9 shows a configuration of the image detection unit that detects the oblique area. This image detection unit has a control circuit (corresponding to a control unit according to the present invention) 20, a control register 21 in which values are set by the control circuit 20, a pixel circuit 22 that executes an image detection process in accordance with the value set in the control register 21, and an image memory 23 stored with pixel values detected by the pixel circuit 22.

The control circuit 20 sets the value in the control register 21 in response to an instruction given from a host device (e.g., a control computer of the defect inspection apparatus). The control register 21 retains the same number of parameter pairs as the number of the pixel circuits 22.

In the present embodiment, the control register 21 retains, for every pixel circuit 22, a control bit for switching ON/OFF an operation of the pixel circuit and a threshold value for binarizing the pixel value detected by the pixel circuit.

The pixel circuit 22 is configured by arraying the plurality of CCD elements (corresponding to a line detection unit according to the present invention) in line. The configuration of arraying the CCD elements in line is the same as in the conventional defect inspection apparatus. A feature of the pixel detection unit according to the present embodiment resides in such a point that the operations of these CCD elements can be individually switched ON or OFF, and the threshold value for binarizing the detected pixel value of the CCD element is changed over.

Figure 10:
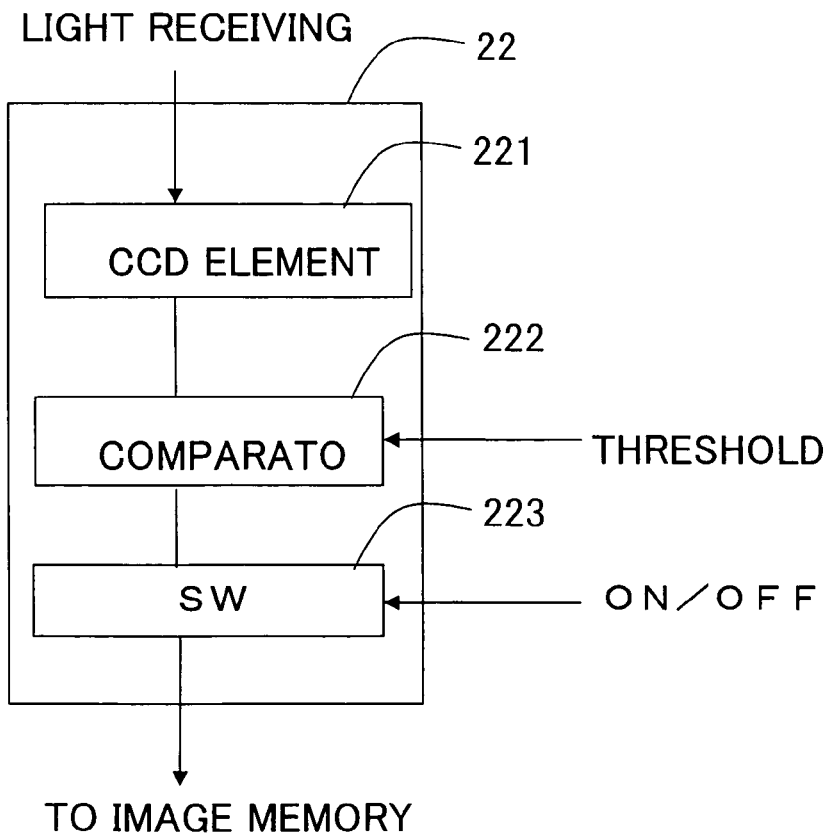
FIG. 10 is a diagram showing an example of a configuration of a pixel circuit.

FIG. 10 shows an example of a configuration of one pixel circuit 22. The example in FIG. 10 is that the pixel circuit 22 includes a CCD element 221 for receiving the light, a comparator 222 for comparing an output of the CCD element 221 with a predetermined threshold value, and a switch 223 that controls as to whether the output of the comparator 222 is sent to the image memory 23 or not.

With such a configuration, during the inspection of the half-tone layer 2, the threshold value corresponding to a comparatively low contrast is set because of binarizing the image of the half-tone layer 2. On the other hand, during the inspection of the light shielding layer 3, the threshold value corresponding to a comparatively high contrast is set because of binarizing the (image of) light shielding layer 3.

Then, the control circuit 20, when scanning over the reticle, controls the number of the pixel circuits 22 operating effectively, i.e., an effective width of the line-array CCD elements by conducting ON/OFF setting of the switch 223 in the control register 21. As a result, the image detection unit scans the inspection target and changes the line width, thus acquiring the image from, e.g., a trapezoidal inspection area.

Figure 11:
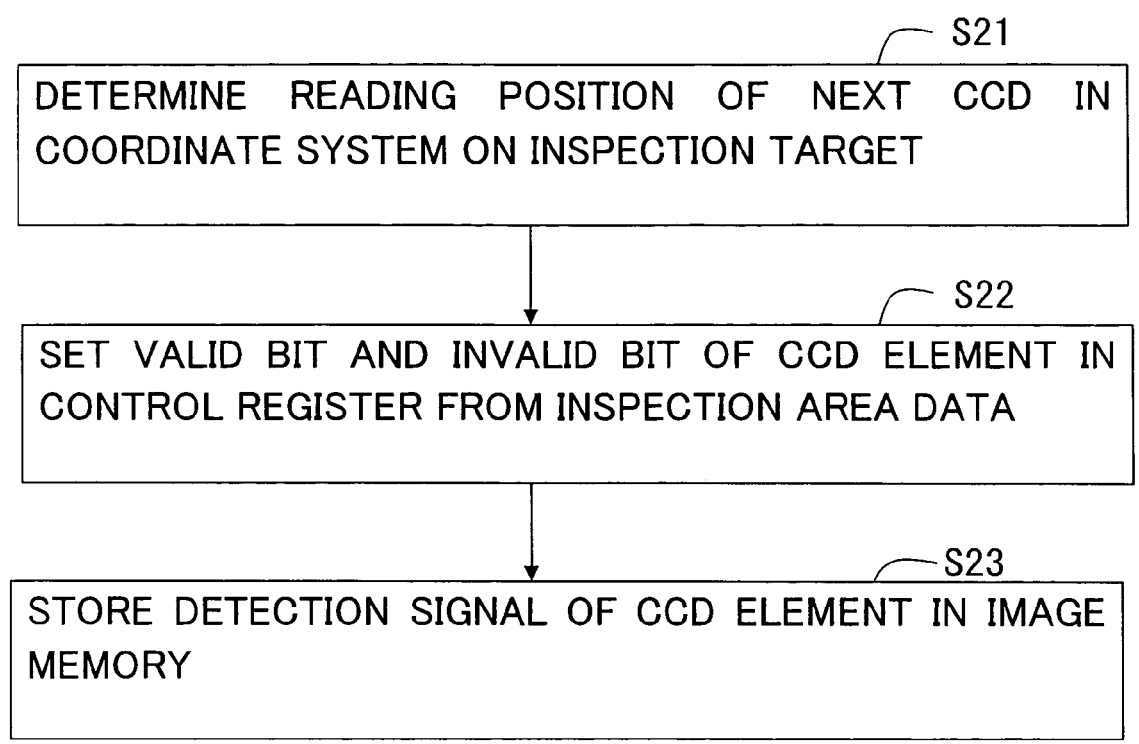
FIG. 11 is a flowchart showing a processing procedure of a control circuit and the pixel circuit.

FIG. 11 shows a processing procedure of the control circuit 20 and of the pixel circuit 22 controlled by the control circuit 20. In this process, the control circuit 20 determines a next reading position (a position in a line-scanning direction of the line-array elements) of the CCD element in the coordinate system on the inspection target (on the reticle) (S21).

Then, the control bit for switching ON or OFF the line-array CCD elements is set in the control register from information that specifies the inspection area set in the reticle inspection apparatus (S22).

Then, the binarized pixel data are set in the image memory 23 from the line-array CCD elements (S23). Note that the binary image stored in the image memory 23 is transmitted via the control circuit to a host device, e.g., an image processing unit that collates the detected binary image with the inspection data (refer to the process in S9 in FIG. 3).

Thus, in the present reticle defect inspection apparatus, the image can be read from the inspection target in a way that changes the line width corresponding to an in-scan position.

Further, the threshold value for binarizing the image can be set corresponding to the in-scan position.

<Second Flow by Defect Inspection Apparatus for Inspecting Oblique Area>

Figure 12:
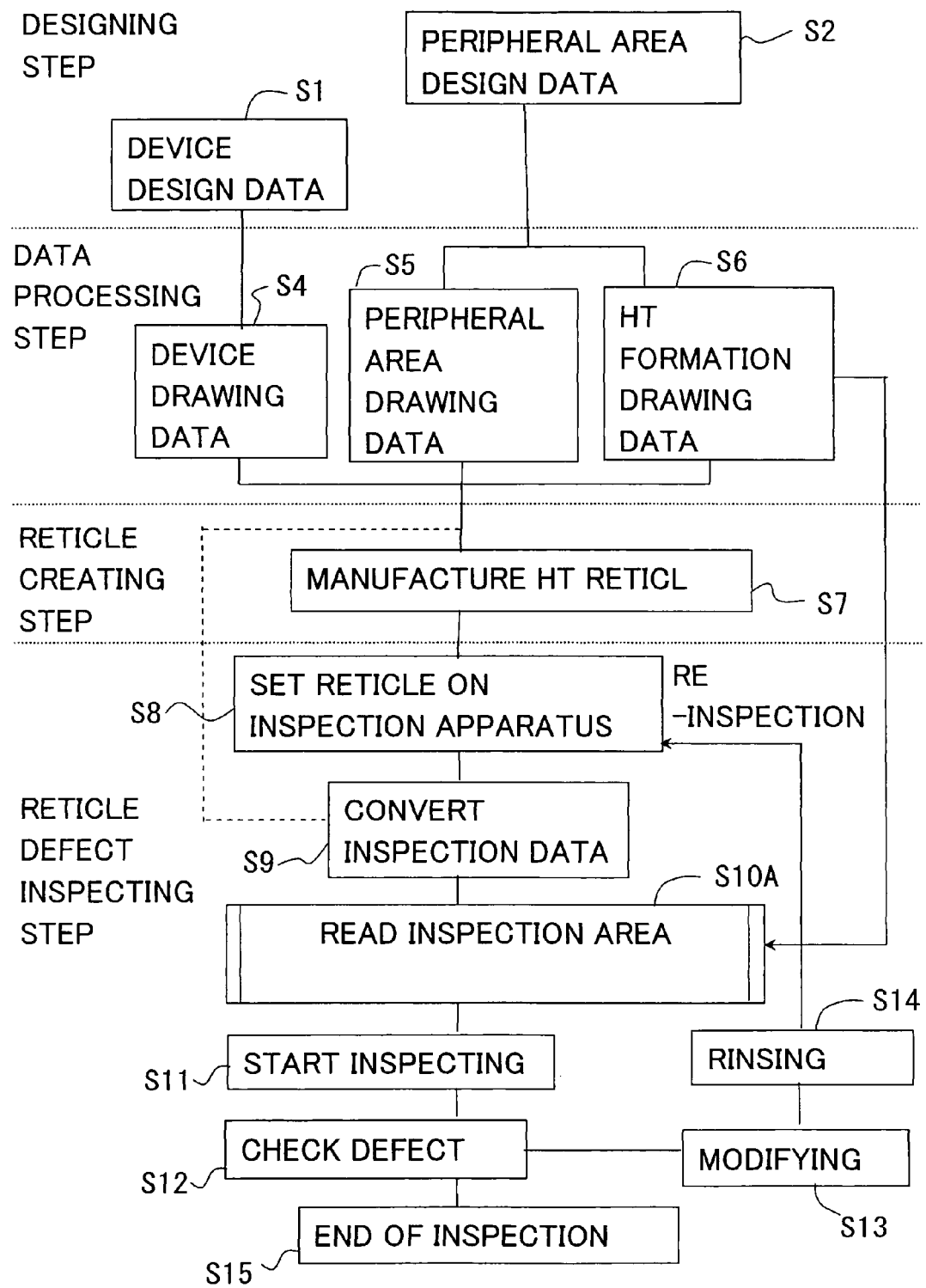
FIG. 12 is a second flow of inspecting the reticle defect.

FIG. 12 shows a second flow into which the first flow is improved. In the second flow, the defect inspection apparatus for inspecting the oblique area described above executes the reticle inspection.

Herein, the design data are created by the device design (S1) and the peripheral area design (S2) in the same way as in the first flow. In the data processing step (S4-S6), the device drawing data are created from the design data (the result of S1) of the device area in order to create the reticle drawing data (S4). Further, the peripheral area drawing data and the drawing data for forming the half-tone layer 2 are created from the peripheral area design data (the result of S2) (S5, S6).

In the reticle manufacturing step (S7), the half-tone type reticle is manufactured from the drawing data created in the flow of S1-S6 by use of the reticle drawing apparatus. In the defect inspection step (S8-S14) of the reticle, the half-tone type reticle is set on the reticle defect inspection apparatus (S8). Moreover, the device drawing data (the result of S4) and the peripheral area drawing data (the result of S5) are converted into inspection data (S9).

Next, the drawing data for forming the half-tone layer (which are the data created as the result of S6; see to FIG. 5) created in the data processing step described above, are inputted as the data of the half-tone area to the defect inspection apparatus, wherein the defect inspection apparatus is made to recognize the inspection area (S10A). This process is called an inspection area reading process. This process enables the defect of the half-tone type reticle to be inspected by binarizing (the images of) the half-tone layer 2 and of the glass layer.

The inspection starts in S11 in FIG. 12. The reticle defect inspection apparatus, when scanning the half-tone area, acquires the image of the trapezoidal area having the lines (sides) oblique to the scan advancing direction by changing the line width of the image detection unit.

If the defect occurs in a defect check (S12), the defect is repaired by employing a repair apparatus (an FIB (Focused Ion Beam) apparatus, a laser repairing apparatus, etc) (S13). Further, the reticle is rinsed (S14) and, returning to the step in S8, the reticle is re-inspected.

Thereafter, the inspection process in S8-S12 is executed. Then, if any defect is not confirmed (detected) in the defect check (S12), the inspection comes to an end (S15).

Figure 13:
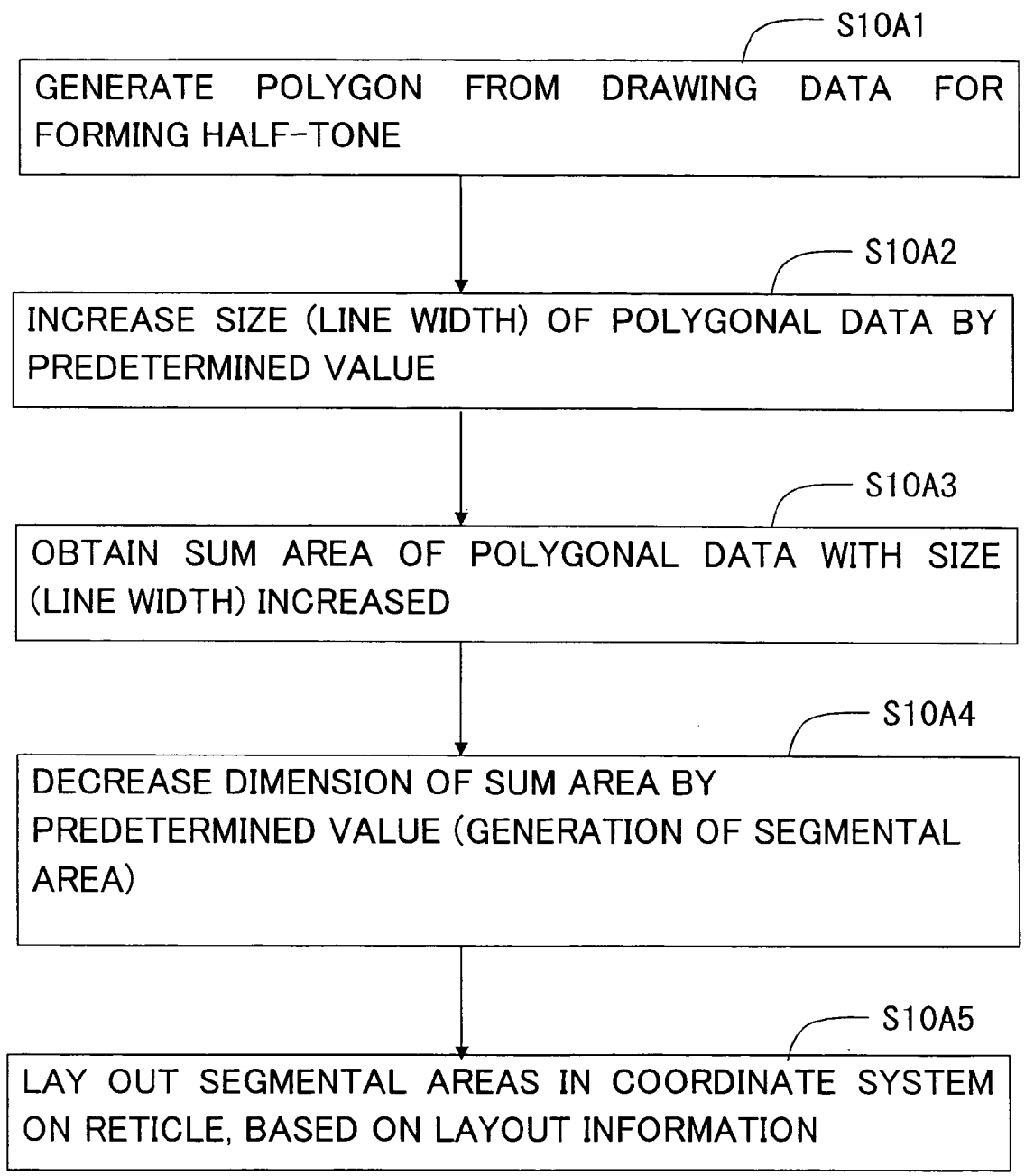
FIG. 13 is a flowchart showing details of an inspection area reading process.

FIG. 13 shows an inspection area reading process (which is a detailed process of S10A in FIG. 12). This process can be actualized as, e.g., a process (which is part of a control program) of the control computer that controls the reticle defect inspection apparatus. The process in FIG. 13 may, however, also be executed by an off-line computer, and a result of this execution may be read by the reticle defect inspection apparatus.

In this process, the reticle defect inspection apparatus generates the polygonal data from the drawing data for forming the half-tone (S10A1). The polygonal data are data that represent the drawing pattern of the half-tone formation drawing data by a polygonal shape (a string of vertexes).

Next, the reticle defect inspection apparatus increases a size (e.g., a line width etc) of the polygonal data by a predetermined value (S10A2). This predetermined value is the dimension (size) for compensating a non-drawing area contained in the polygonal data and can be determined from the design data. For instance, a value over a dimension of a gap between lines of the half-tone formation drawing data may be set.

Subsequently, the reticle defect inspection apparatus obtains a sum area of the polygonal data with the size increased. Namely, the reticle defect inspection apparatus executes an OR operation about the polygonal data (S10A3).

Next, the reticle defect inspection apparatus decreases the dimension of the sum area by the predetermined value by which to increase the polygonal data. With this contrivance, an outer peripheral area gets back to the outer peripheral position of the half-tone drawing data. To be specific, the data about the inspection area, in which the gaps within the half-tone drawing data are filled up, are created by the process in S10A2 through S10A4. The reticle defect inspection apparatus (e.g., the control computer thereof) executing the process in S10A1 through S10A4 corresponds to a first segmental area generating unit according to the present invention.

Further, the reticle defect inspection apparatus develops the inspection area on the reticle from drawing data layout information (corresponding to layout data according to the present invention), and generates the inspection area in the coordinate system on the reticle (S10A5). Herein, the drawing data layout information connotes, if the semiconductor device on the reticle is constructed of a plurality of device elements, position information for laying out the respective device elements on the reticle. With this information, the reticle defect inspection apparatus selects a portion of the inspection area and can perform the defect inspection.

From the above-mentioned, when inspecting the half-tone type reticle, according to the inspection method in the first flow shown in FIG. 3, in the case of designating the oblique inspection area other than the rectangle, it is required that the oblique area be excluded by designating the inspection area and the non-inspection area. Therefore, it is troublesome that the coordinates of the inspection area and the non-inspection area are previously calculated and inputted to the reticle defect inspection apparatus. Moreover, it is impossible to inspect an overlapped area of the non-inspection area with the half-tone area in FIGS. 6 and 7.

On the other hand, according to the inspection method in the second flow, the inspection area is designated by directly utilizing the drawing data for forming the half-tone, which are employed when manufacturing the half-tone type reticle. This type of process eliminates the necessity of calculating the coordinate values of the inspection area and of the non-inspection area and of inputting these values to the inspection apparatus, whereby the number of steps is reduced and the efficient inspection is conducted. Further, the half-tone area can be all designated as the inspection area, and hence the effective area of the device is expanded, with the result that the circuit pattern area for the semiconductor can be enlarged. As a consequence, the futile area can be eliminated, and the final chip size can be reduced.

The drawing data for forming the half-tone layer used for the reticle drawing can be utilized for the inspection area, thereby making it possible to omit the coordinate value calculation process of the inspection area and the non-inspection area, which is carried out humanly as in the first flow.

Further, the non-inspection area of the half-tone type reticle can be excluded, the entire half-tone area containing the oblique lines can be inspected, and the half-tone type reticle exhibiting high reliability can be provided. Moreover, it is feasible to enlarge the circuit pattern area for the semiconductor and to reduce the chip size. In the main area of the half-tone type reticle, even when the light shielding layer, the light transmitting region and the half-tone phase shift region exist intermixedly with a boundary line in a direction oblique to the scan direction being interposed therebetween, the efficient inspection can be conducted by the method based on the present second flow.

Namely, according to the defect inspection apparatus in the present embodiment, even when the inspection area contains the oblique area taking the trapezoidal shape, the pixel circuit 22 for detecting the image by line-scanning the inspection target changes over the ON- or OFF-setting, whereby the line width can be changed together with the scan.

Further, according to the defect inspection apparatus in the present embodiment, the threshold value for binarizing can be changed in each inspection target area. Hence, even in the area with its corners chamfered obliquely excluding the rectangular area, it is possible to distinguish between the glass layer and the light shielding layer 3 and between the glass layer and the half-tone layer 2, whereby these layers can be inspected as the binary images.

MODIFIED EXAMPLE

In the processes (FIGS. 12 and 13) in the embodiment, the data about the inspection area are generated from the half-tone drawing data (refer to S10A2-S10A4 in FIG. 13). The present embodiment is not, however, limited to these processes. For example, the data specifying the inspection area may also be retained in a specified layer within the design data of the semiconductor device. FIGS. 14A-14E show a processing example in such a case. The reticle defect inspection apparatus (e.g., its control computer) executing this process corresponds to a second segmental area generating unit according to the present invention.

Figure 14A:
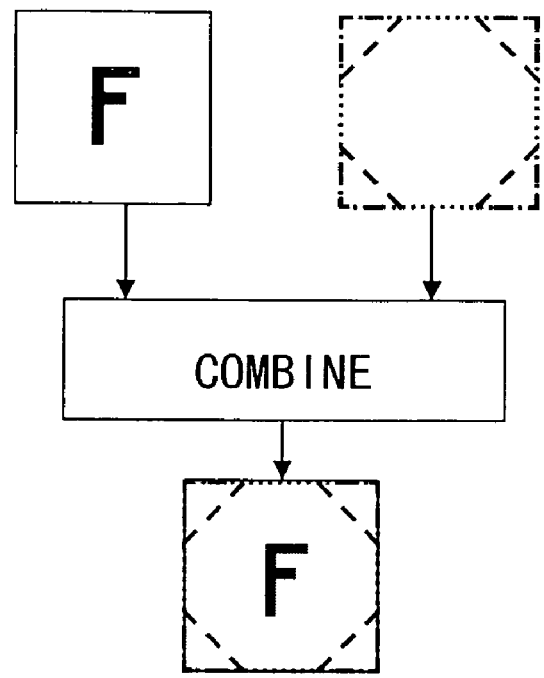
FIG. 14A is an outline of an inspection area generating procedure according to a modified example (part 1)

As shown in FIG. 14A, in this process, a pattern layer for designating the inspection area is previously incorporated into the original design data. In FIG. 14A, a half-tone forming area (layer 1) and an area (layer 2) to chamfer corners of the half-tone forming area are respectively defined in a layer different from the F-shaped device pattern layer. Then, there are created the original design data into which these layers (1 and 2) are previously incorporated together with the data of each of the layers of the device pattern.

Figure 14B:
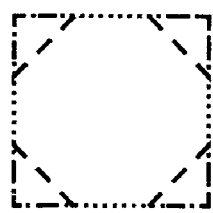
FIG. 14B is an outline of the inspection area generating procedure according to the modified example (part 2)

Then, the reticle defect inspection apparatus (e.g., the control computer) extracts, as illustrated in FIG. 14B, the inspection area (layer 1) and the non-inspection area (layer 2) to chamfer corners of the inspection area, from the original design data (FIG. 14B). The "layer" is defined as an attribute of the pattern data contained in the original design data. The "layer" is information showing the step of manufacturing the semiconductor device, or information for distinguishing between the layers building up the semiconductor device.

Figure 14C:
FIG. 14C is an outline of the inspection area generating procedure according to the modified example (part 3)

Subsequently, the reticle defect inspection apparatus calculates a difference between the layer 1 and the layer 2, thereby creating the chamfered inspection area (corresponding to segmental area data according to the present invention) (FIG. 14C).

Figure 14D:
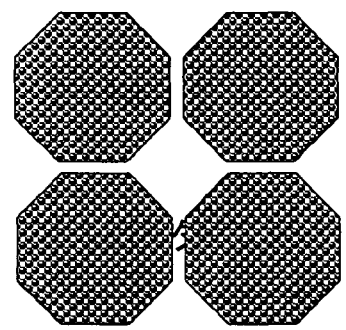
FIG. 14D is an outline of the inspection area generating procedure according to the modified example (part 4)
Figure 14E:
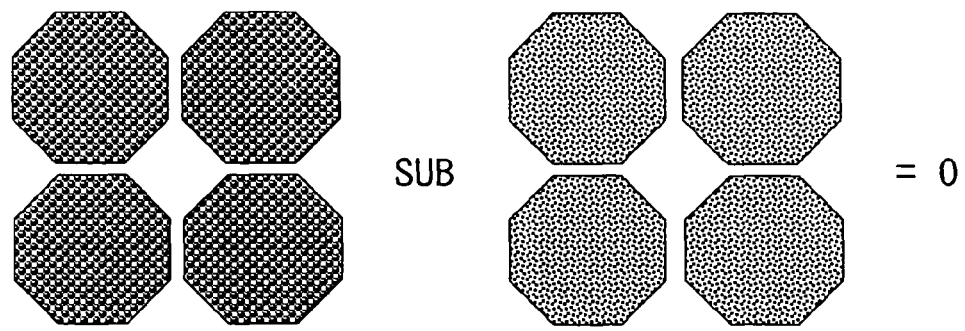
FIG. 14E is an outline of the inspection area generating procedure according to the modified example (part 5).

Further, the reticle defect inspection apparatus develops the chamfered inspection area on the reticle from the drawing data layout information, and generates the inspection area in the coordinate system on the reticle (FIG. 14D). Herein, the "drawing data layout information" connotes, if the semiconductor device on the reticle is constructed of the plurality of device elements, the position information for laying out the respective device elements on the reticle. The process shown in FIG. 13 is executed with respect to the thus-obtained inspection area, thereby enabling the defect inspection to be done in a way that distinguishes between the half-tone layer 2 and the light shielding layer 3.

Moreover, there may be provided a step of comparatively verifying the inspection area created in the process in FIGS. 14A-14D and the inspection data generated from the half-tone formation drawing data (the result of S6 in FIG. 12) in the process in FIG. 12. The reliability of the inspection can be improved by making the comparison between pieces of data generated in the different steps.

ANOTHER MODIFIED EXAMPLE

The embodiment has given the discussion on the method and the apparatus for inspecting the reticle in which the area of the light shielding layer 3 and the area of the half-tone layer 2 exist, with the lines (sides) extending obliquely to the scan direction being interposed therebetween. The embodiment of the present invention is not, however, limited to such a configuration, and the present invention can be applied to, for instance, the inspection of the reticle, wherein the area of the light shielding layer 3 and the area of the half-tone layer 2 exist, with a polygonal line or a curbed line being interposed therebetween. In this case, the inspection area may be designated by, e.g., bitmap.

<Others> the disclosures of Japanese patent application No. JP2006-162155 filed on Jun. 12, 2006 including the specification, drawings and abstract are incorporated herein by reference.

What is claimed is:

1. An inspection apparatus of a mask for exposure that has a light shielding region and a half-tone region on a transparent substrate, comprising:
    a storage unit stored with half-tone pattern area data specifying an existing area of the half-tone region;
    a pattern detection unit to acquire a binary image of an area on scanning over the surface of the transparent substrate by a relative movement with respect to the transparent substrate; and
    a control unit to make effective a detecting operation of the pattern detection unit in the area on the transparent substrate that is specified by the half-tone pattern area data, and to make ineffective the detecting operation of the pattern detection unit outside the specified area.

2. The inspection apparatus of a mask for exposure according to claim 1, wherein the half-tone pattern area data include layout data specifying a layout of one or more semiconductor device patterns onto the transparent substrate and segmental area data specifying an existing area of the half-tone pattern region combined with the semiconductor device pattern to be laid out on the transparent substrate on the basis of the layout data.

3. The inspection apparatus of a mask for exposure according to claim 2, further comprising an input unit to which at least one of the half-tone pattern area data, the segmental area data and the layout data is inputted by an operation of an operator.

4. The inspection apparatus of a mask for exposure according to claim 2, further comprising a first segmental area data generating unit to generate the segmental area data from half-tone pattern data that specifies a pattern shape of the half-tone pattern region.

5. The inspection apparatus of a mask for exposure according to claim 2, further comprising a second segmental area data generating unit to generate the segmental area data from semiconductor device design data if data specifying the existing area of the pattern shape of the half-tone pattern region is contained in the semiconductor device design data in which to define plural layers of semiconductor device patterns corresponding to a plurality of manufacturing steps of the semiconductor device.

6. The inspection apparatus of a mask for exposure according to claim 2, further comprising:
    a first segmental area data generating unit to generate the segmental area data from the half-tone pattern data that specifies the pattern shape of the half-tone pattern region;
    a second segmental area data generating unit to generate the segmental area data from semiconductor device design data if data specifying the existing area of the pattern shape of the half-tone pattern region is contained in the semiconductor device design data in which to define plural layers of semiconductor device patterns corresponding to a plurality of manufacturing steps of the semiconductor device; and
    a comparing unit to compare the segmental area data generated by the first segmental area data generating unit with the segmental area data generated by the second segmental area data generating unit.

7. The inspection apparatus of a mask for exposure according to claim 1, wherein the pattern detection unit includes a line image detection unit in which plural image detection elements are arranged in line, and
    the control unit includes a line width control unit that changes a line width of a line image including a combination of detection signals from the image detection units arranged in line when the line image detection unit moves relatively to the transparent substrate.

8. An inspection method of a mask for exposure that has a light shielding region and a half-tone region on a transparent substrate, comprising:
    reading half-tone pattern area data from a storage unit stored with the half-tone pattern area data specifying an existing area of the half-tone region;
    acquiring a binary image of an area on scanning over the surface of the transparent substrate by a pattern detection unit making a relative movement with respect to the transparent substrate; and
    making effective a detecting operation of the pattern detection unit in the area on the transparent substrate that is specified by the half-tone pattern area data, and making ineffective the detecting operation of the pattern detection unit outside the specified area.

9. A manufacturing method of a mask for exposure that has a light shielding region and a half-tone region on a transparent substrate, comprising:
    forming the light shielding region on the transparent substrate;
    forming the half-tone region on the transparent substrate;
    reading half-tone pattern area data from a storage unit stored with the half-tone pattern area data specifying an existing area of the half-tone region;
    acquiring a binary image of an area on scanning over the surface of the transparent substrate by a pattern detection unit making a relative movement with respect to the transparent substrate; and
    making effective a detecting operation of the pattern detection unit in the area on the transparent substrate that is specified by the half-tone pattern area data, and making ineffective the detecting operation of the pattern detection unit outside the specified area.

10. A mask for exposure that has a light shielding region and a half-tone region on a transparent substrate, the mask being manufactured by executing:

reading half-tone pattern area data from a storage unit stored with the half-tone pattern area data specifying an existing area of the half-tone region;

acquiring a binary image of an area on scanning over the surface of the transparent substrate by making a relative movement with respect to the transparent substrate; and making effective a detecting operation of the pattern detection unit in the area on the transparent substrate that is specified by the half-tone pattern area data, and making ineffective the detecting operation of the pattern detection unit outside the specified area.

11. The mask for exposure according to claim 10, wherein the half-tone pattern region or the existing area of the half-tone region includes a shape other than a rectangle.

* * * * *